(12) United States Patent
Shimada (10) Patent No.: US 6,293,809 B1
(45) Date of Patent: Sep. 25, 2001

(54) SOCKET FOR ELECTRICAL PARTS (75) Inventor: Hideo Shimada, Kawaguchi (JP)

(73) Assignee: Enplas Corporation, Saitama-ken (JP)

( * ) Notice: Subject to any disclaimer, the term of this patent is extended or adjusted under 35 U.S.C. 154(b) by 0 days.

(21) Appl. No.: 09/473,797

(22) Filed: Dec. 28, 1999

(30) Foreign Application Priority Data

Dec. 28, 1998 (JP) .................................................. 10-373143

(51) Int. Cl.[7] .................................................. H01R 12/00
(52) U.S. Cl. .............................. 439/71; 439/331; 439/342
(58) Field of Search ..................... 439/70, 71, 331, 439/342, 343

(56) References Cited

U.S. PATENT DOCUMENTS

| 5,013,256 | * | 5/1991 | Matsuoka et al. | 439/342 |
| 5,419,710 | * | 5/1995 | Pfaff | 439/71 |
| 5,649,836 | * | 7/1997 | Kashiwagi | 439/342 |
| 5,730,606 | * | 3/1998 | Sinclair | 439/70 |
| 5,833,472 | * | 11/1998 | Bright | 439/70 |

* cited by examiner

*Primary Examiner*—Tulsidas Patel
(74) *Attorney, Agent, or Firm*—Fish & Richardson P.C.

(57) ABSTRACT

A socket for an electrical part includes a socket body, an accommodation portion formed to the socket body and adapted to receive an electrical part to which a plurality of terminals are arranged with a predetermined pitch, a plurality of contact pins arranged to the socket body and adapted to contact to or separate from the terminals, respectively, and a positioning structure, comprising a plurality of projection members, formed to the accommodation portion of the socket body for positioning at least two terminals separated by a plurality of pitches on the accommodation.

11 Claims, 7 Drawing Sheets

SOCKET FOR ELECTRICAL PARTS

BACKGROUND OF THE INVENTION

1. Field of the Invention

The present invention relates to a socket for electrical parts for detachably holding electrical parts such as semiconductor devices (called "IC package" hereinlater), and more particularly, a socket for electrical parts having an improved structure for positioning the electrical parts.

2. Related Art of the Invention

In conventional art, there is known an IC socket, as such socket for electrical parts, for detachably holding an IC package as electrical part.

There is known, as such IC package, a BGA (Ball Grid Array) type, in which a number of almost spherical solder (soldered or soldering) ball (terminals) are arranged in shape of matrix to a lower surface of, for example, a rectangular package so as to project downward.

On the other hand, the IC socket is provided with a socket body having an IC package accommodation portion on which the IC package is positioned and accommodated in a predetermined portion, and each of the solder balls of the IC package is clamped between a pair of elastic pieces of a contact pin thereby to establish an electrical connection between the IC socket and the IC package.

However, in the IC socket having the conventional structure mentioned above, it is difficult to precisely locate the IC package to the predetermined position of the accommodation portion of the socket body, and there is a fear of the solder balls being displaced in position, resulting in failure of contact to the contact pins and a fear of damaging the solder balls.

SUMMARY OF THE INVENTION

An object of the present invention is to substantially eliminate defects or drawbacks encountered in the prior art mentioned above and to provide a socket for electrical parts capable of easily positioning the electrical parts, preventing contact failure of terminals and preventing the terminals from being damaged.

This and other objects can be achieved according to the present invention by providing a socket for an electrical part comprising:

a socket body;

an accommodation portion formed to the socket body and adapted to receive an electrical part to which a plurality of terminals are arranged with a predetermined pitch;

a plurality of contact pins arranged to the socket body and adapted to contact to or separate from the terminals, respectively; and a positioning structure formed to the accommodation portion of the socket body for positioning at least two terminals separated by a plurality of pitches on the accommodation portion.

According to this structure, since at least two terminals having a plurality of pitches are positioned, the positioning precision or performance of the electrical part with respect to the socket body can be further improved, and moreover, the contact failure and damages to the terminal such as solder ball can be effectively prevented. Furthermore, in comparison with a structure in which all the terminals are to be positioned, in the present invention, the terminals are positioned at only at least tow portions, so that the manufacturing efficiency of molds and the productivity of the positioning structure can be improved.

In preferred embodiments of the present invention of the aspect mentioned above, the terminal of the electrical part is restricted in a movement thereof in one direction by the positioning structure and restricted in a movement in another one direction by the contact pin.

The contact pin projects over a surface of the accommodation portion of the socket body. The contact pin is formed with a pair of elastic pieces having front end portions between which the terminal is clamped and the clamping direction accords with the another one direction, being normal to the one direction mentioned above.

The electrical part has a substantially rectangular shape and the positioning structure includes at least two positioning members arranged at positions corresponding to at least two terminals disposed to outermost portions on diagonal lines of the rectangular shape of the electrical part. The positioning structure may comprises four positioning members arranged at four corner portions of the rectangular electrical part on diagonal lines thereof.

The positioning structure comprises a projection member projecting over a surface of the accommodation portion of the socket body. The projection member is composed of a pair of projections between which the terminal is to be held.

In the preferred embodiments, the socket is an IC socket and the electrical part is an IC package.

According to the structures of the preferred embodiments mentioned above, since one terminal is restricted in its position from a plurality of directions by the positioning structure composed of positioning members and the contact pin, the positioning precision can be further improved. Furthermore, the distance between the positioning members can be made maximum, so that the positioning precision can be still further improved.

Furthermore, in the present invention, the projections as the positioning structure and the contact pins are arranged so as to project over the electrical part accommodation portion of the socket body. Therefore, in comparison with the structure that the entire surface of the electrical part contacts the accommodation surface of the socket body, a gap exists at the lower surface portion of the electrical part, and accordingly, the heat radiation effect to the heat generated to the electrical part at a time of Burn-in Test will be improved. Furthermore, there is reduced the possibility of the electrical part being inserted in an inclined manner due to the dispersion of the flatness of the electrical part mounting surface of adhesion of foreign material and bowing (warping) or the like of the electrical part will be slightly acceptable.

Furthermore, the elastic pieces have elasticity, so that the dispersion in performance of the terminals at the manufacturing time thereof can be somewhat acceptable.

The nature and further characteristic features of the present invention will be made more clear from the following descriptions made with reference to the accompanying drawings.

BRIEF DESCRIPTION OF THE DRAWINGS

In the accompanying drawings:

FIGS. 9A, 9B and 9C are sectional views showing functions of the first embodiment, in which FIG. 9A shows a state that a pair of contact portions of the contact pin are closed, FIG. 9B shows a state that the paired contact portions of the contact pin are opened, and FIG. 9C shows a state that a solder ball is held between the paired contact portions of the contact pin; and FIGS. 10A and 10B are sectional views showing essential portions of a second embodiment of the present invention, in which FIG. 10A shows a state that the contact pin is closed and FIG. 10B shows a state that the contact pin is opened.

DESCRIPTION OF THE PREFERRED EMBODIMENTS

First Embodiment

FIGS. 1 to 9 represent a first embodiment according to the present invention.

With reference to FIGS. 1 to 9, reference numeral 11 denotes an IC socket as "socket for electrical parts" and the IC socket is adapted to establish electrical connection between a solder ball 12b as a terminal of an IC package 12 as an "electrical part" and a printed circuit board, not shown, of a measuring device, i.e. tester, in order to carry out a performance test of the IC package 12.

Figure 7A:
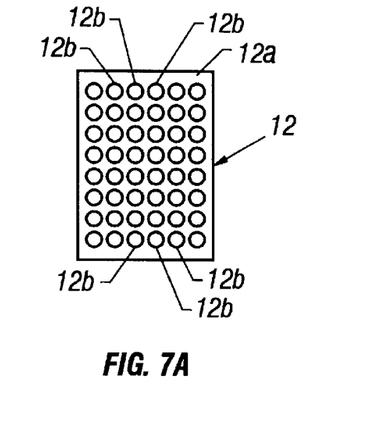
FIG. 7A is a bottom view of an IC package according to the first embodiment.
Figure 7B:
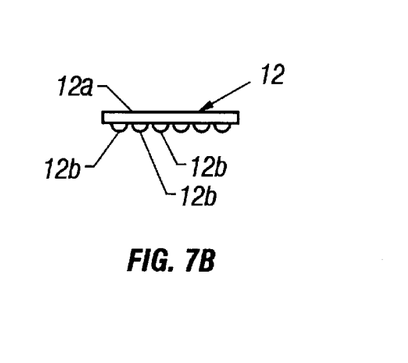
FIG. 7B is a front view thereof.

The IC package 12 is, as shown in FIGS. 7A and 7B, so-called a BGA (Ball Grid Array) type having a structure in which a number of solder balls 12b, each having substantially spherical shape, are arranged on the lower surface of a package body 12a, for example, having a rectangular shape, in a manner that about ⅔ portions of the solder balls 12b protect downward with predetermined pitch in shape of matrix.

Figure 5:
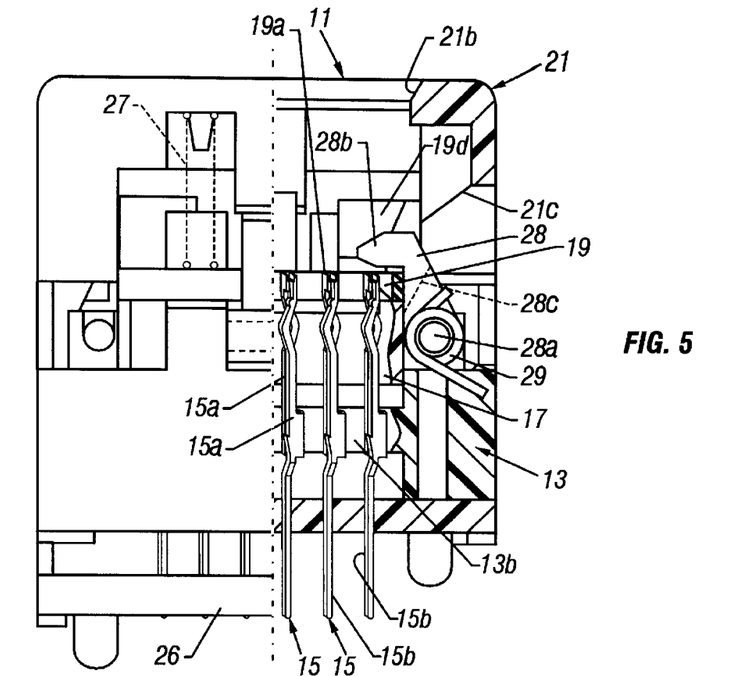
FIG. 5 is a sectional view taken along the line V—V in FIG. 1.

On the other hand, for example, as shown in FIG. 5, the IC socket 11 is basically comprises a socket body 13 having a base portion 13b to which a number of contact pins 15, which are contacted to or separated from the solder balls 12b, are arranged, and a movable plate 17 is also mounted to the socket body 13 so as to displace the contact pins 15. An upper plate 19 is secured to the base portion 13a of the socket body 13 at a portion above the movable plate 17. An upper operation member 21 for vertically moving the movable plate 17 is also mounted to the socket body 13.

Figure 8:
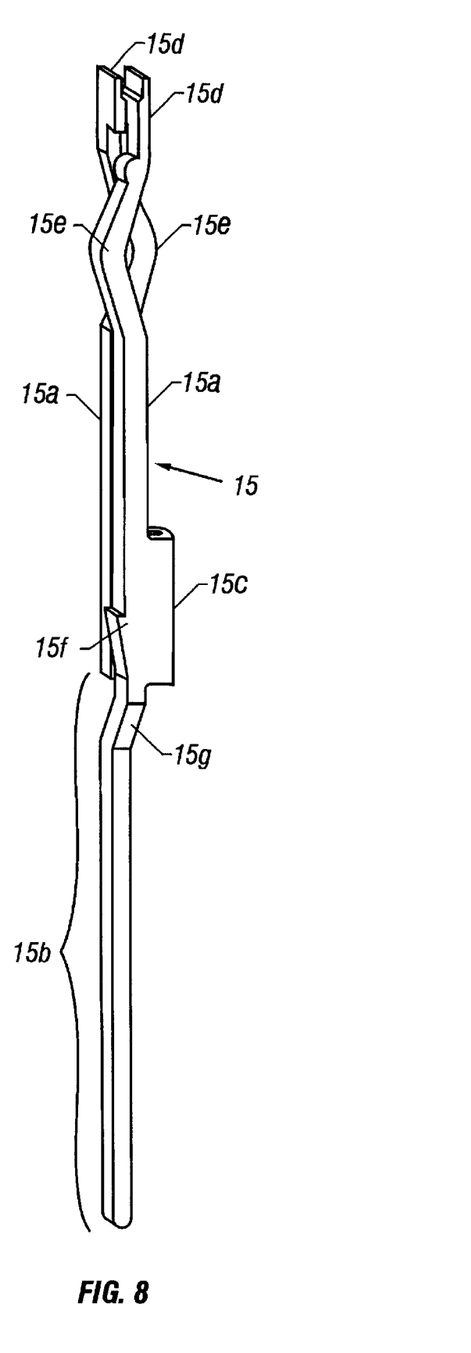
FIG. 8 is a perspective view of a contact pin according to the first embodiment.

The contact pin 15 has a springy or elastic property and is formed from a plate member having a conductivity through a press working so as to provide a shape shown in FIG. 8.

More specifically, the contact pin 15 is formed with a pair of elastic pieces 15a at substantially upper half portion thereof and formed with one solder tail portion 15b at substantially lower half portion thereof. The paired elastic pieces 15a have lower end portions which are formed as common lower base portion 15c having a U-shape so that the elastic pieces 15a are opposed to each other, and a pair of contact portions 15d are formed to the upper (front) end portions of the elastic pieces 15a so as to contact to or separate from the side portion of the solder ball 12b of the IC package 12 thereby to hold or clamp the solder ball 12b between the contact portions 15d.

Furthermore, the elastic pieces 15a are formed with intermediate bent portions 15e protruded in <-shape so that the protruded portions are opposed to each other, and these bent portions 15e cross each other and are pressed by cam portions 17a of the movable plate 17 so as to open the contact portions 15d in a manner mentioned hereinlater.

The solder tail portion 15b and the base portion 15c of each of the the contact pins 15 are press fitted into a fit-hole, not shown, formed to the socket body 13, and a biting portion 15f formed to the base portion 15f bites the socket body 13 thereby to prevent the contact pin 15 from coming off upward. The solder tail portion 15b projecting downward from the socket body 13 further extends downward through a location board 26 and the extending end portion thereof is inserted into an insertion hole of the printed circuit board and then soldered, thus establishing an electrical connection therebetween.

Figure 6:
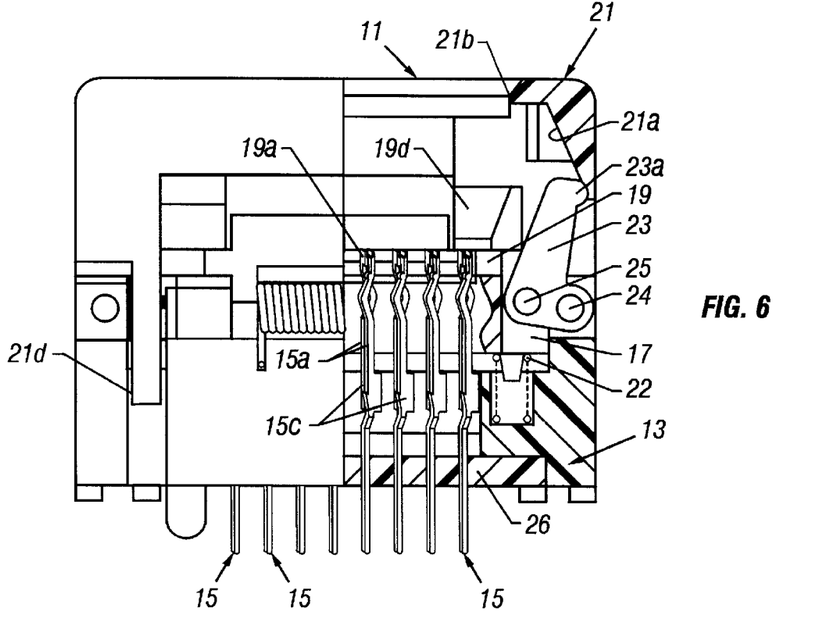
FIG. 6 is a sectional view taken along the line VI—VI in FIG. 1.

The movable plate 17 is, as shown in FIGS. 5 and 6, is mounted on the socket body 13 to be vertically movable in an installed state thereof and urged upward by means of spring 22. The movable plate 17 is vertically moved by a pair of arm members 23, only one of which is shown. The arm member 23 is mounted to the socket body 13 to be pivotal about a shaft (pivot pin) 24 and also mounted to the movable member 23 to be pivotal about a shaft (pivot pin) 25. The arm member 23 has an upper end portion 23a slidably contacting the cam surface 21a of the upper operation member 21. According to this structure, when the upper operation member 21 is lowered, the arm member is pressed by the cam surface 23a and rotated about the shaft 24 in the counterclockwise direction in FIG. 6 thereby to lower the movable plate 17.

Figure 9A:
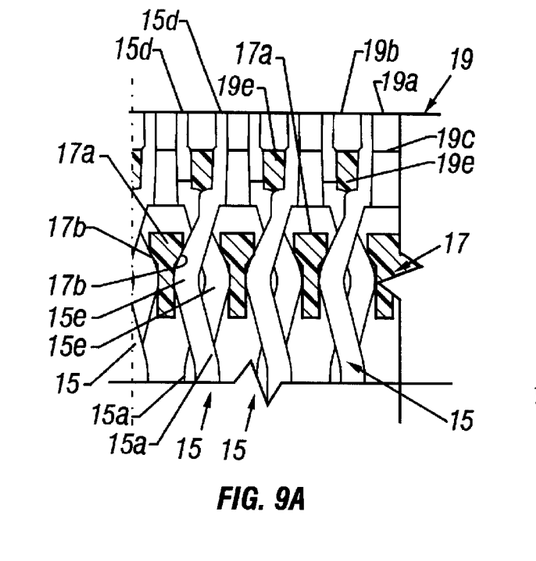
Figure 9B:
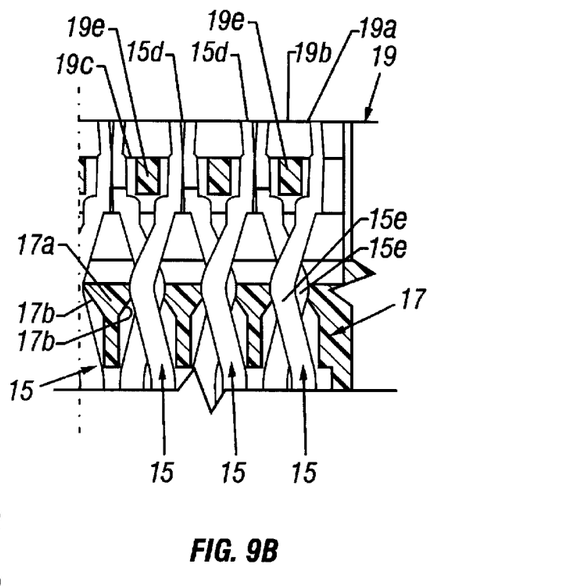
Figure 9C:
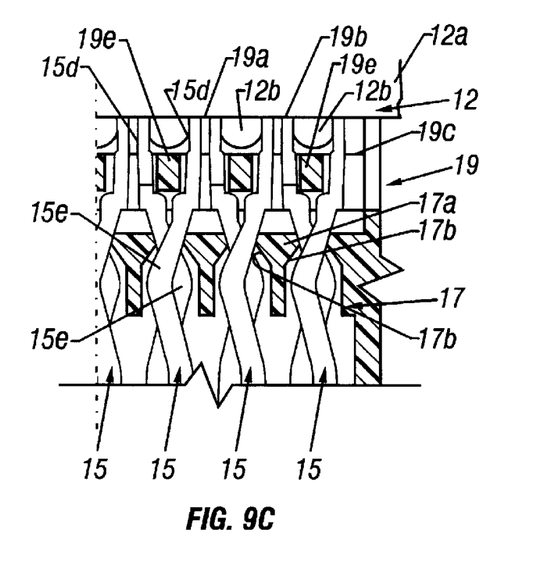

As shown in FIGS. 9A, 9B and 9C, the movable plate 17 is formed with cam portions 17a each positioned between adjacent contact pins 15 and each having sliding surfaces 17b formed on both sides thereof, These sliding surfaces 17b have shapes to push bent portions 15e of the elastic pieces 15a of the contact pins 15 which are disposed on both sides of the cam portion 17a. That is, one cam portion 17a pushes the bent portions 15e of the elastic pieces 15a of the adjacent contact pins 15, and both the bent portions 15e of the paired elastic pieces 15a of the contact pin 15 are pushed by the paired cam portions 17a disposed on both sides thereof in a direction approaching each other, thereby to open both the paired contact portions 15d.

Figure 2:
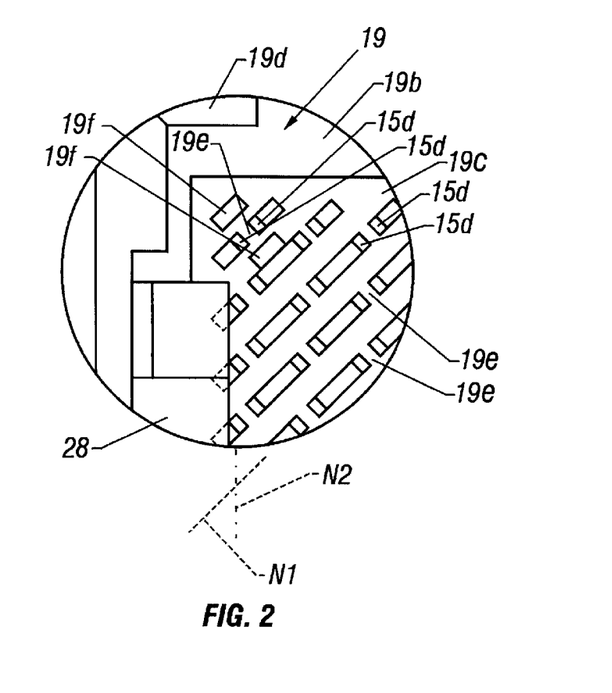
FIG. 2 is an enlarged view of a portion X in FIG. 1 according to the first embodiment.

These contact pins 15 are arranged in matrix shape, and as shown in FIG. 2, the opening-closing direction N1 of the paired contact pins 15 has a predetermined angle of 45°, in the illustrated embodiment, with respect to the arranging direction N2 of the contact portions 15d of the respective contact pins 15.

Incidentally, the upper plate 19 is formed with an accommodation portion 19a so that the IC package 12 is accommodated in the upper side thereof, and the accommodation portion 19a has a peripheral edge portion which is formed with a peripheral accommodation surface 19b against which the lower surface of the peripheral edge portion of the package body 12a abuts and which has a level higher than the inside surface 19c thereof. Furthermore, guide portions 19d, for positioning the IC package 12 to the predetermined position, are formed to the respective corner portions of the peripheral edge portion of the accommodation portion 19a so as to accord with the portions of the package body 12a. Furthermore, as shown in FIGS. 3A, 3B, 4A and 4B, ribs 19e are formed to the upper plate 19, each of the ribs 19e being inserted into a gap between the paired contact portions 15d of the contact pin 15 in a manner that, under the state that any external (outer) force is not applied to both the elastic pieces 15a of the contact pin 15 (i.e. a state that both the contact portions 15d are closed), the positioning rib 19e is held and clamped by the paired elastic pieces 15a.

Figure 3A:
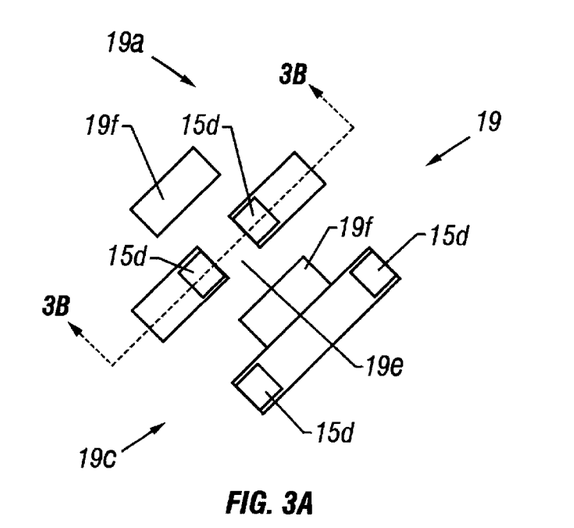
FIG. 3A is an enlarged plan view of an essential portion of the first embodiment and FIG. 3B is a sectional view taken along the line IIIB—IIIB in FIG. 3A.
Figure 3B:
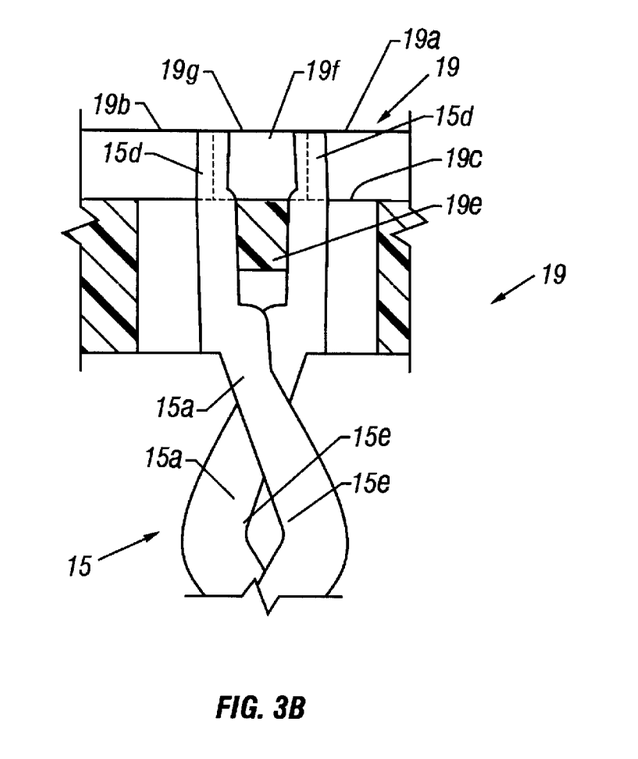
Figure 4A:
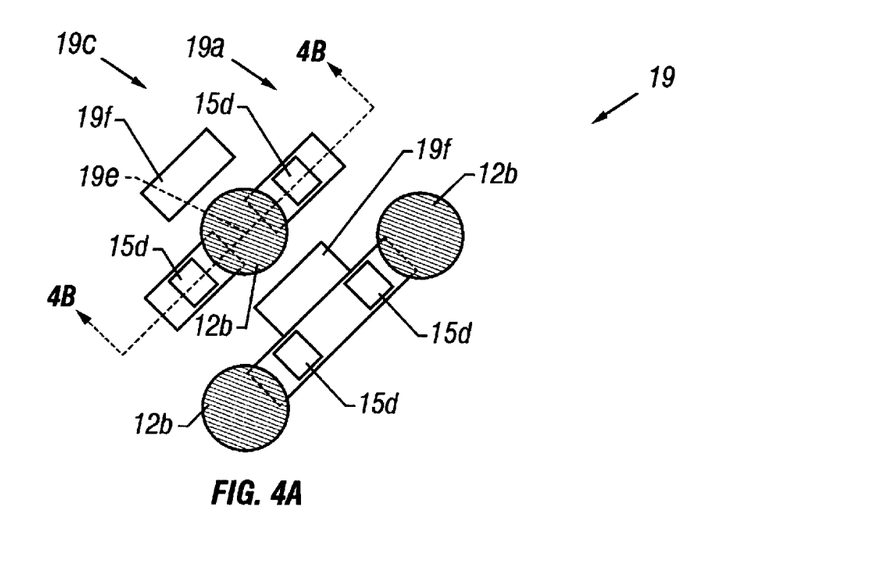
FIG. 4A is an enlarged plan view showing an essential portion of a solder ball arrangement in the first embodiment and FIG. 4B is a sectional view taken along the line IVB—IVB in FIG. 4A.
Figure 4B:
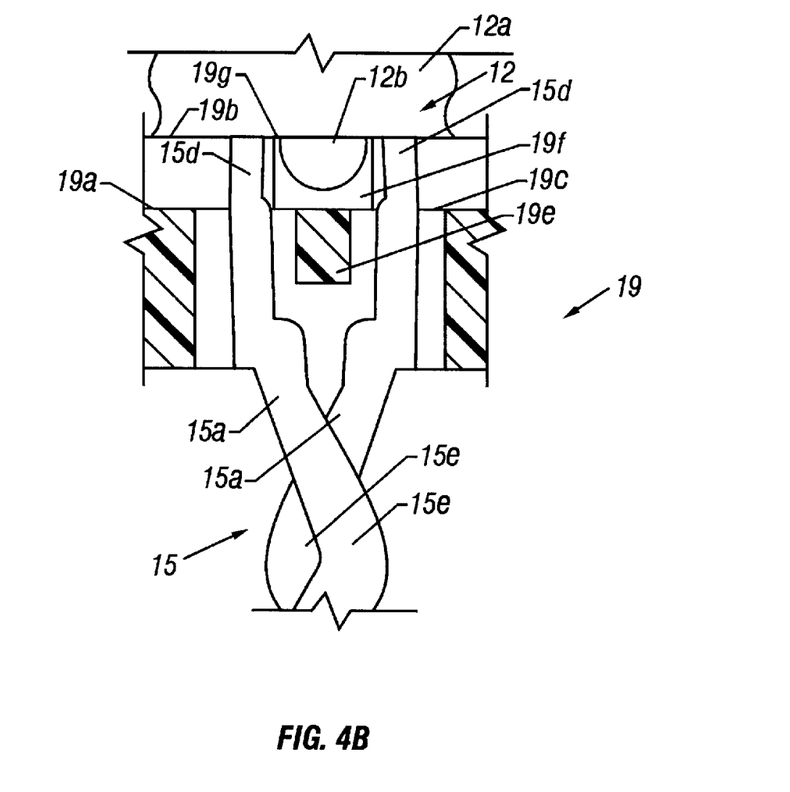

Still furthermore, a plurality of paired projections 19f are formed, as positioning structure, to the inside surface 19c surrounded by the peripheral accommodation surface 19b of the accommodation portion 19a of the upper plate 19. These paired projections 19f are arranged to the portions corresponding to the four solder balls 12b arranged to the outermost portions on the diagonal lines of the rectangular IC package 12 so that the paired projections 19f are arranged in conformity with the respective solder balls 12b separated by a plurality of pitches. As shown in FIG. 3B, the height level of the upper end surface of the projection 19f and the height level of the upper end surface of the contact portion 15d of the contact pin 15 are substantially equal to that of the peripheral edge surface 19b of the upper plate 19.

When the solder balls 12b are inserted into the gaps between the respective paired projections 19f, the movement of the IC package 12 in the diagonal (one) direction is restricted thereby to be positioned. Further, under the state that the paired contact portions 15d of the contact pins 15 are opened, when the solder ball 12b is inserted therebetween, the movement in a direction (direction perpendicular (normal) to that one direction) different from the above one direction is restricted.

Figure 1:
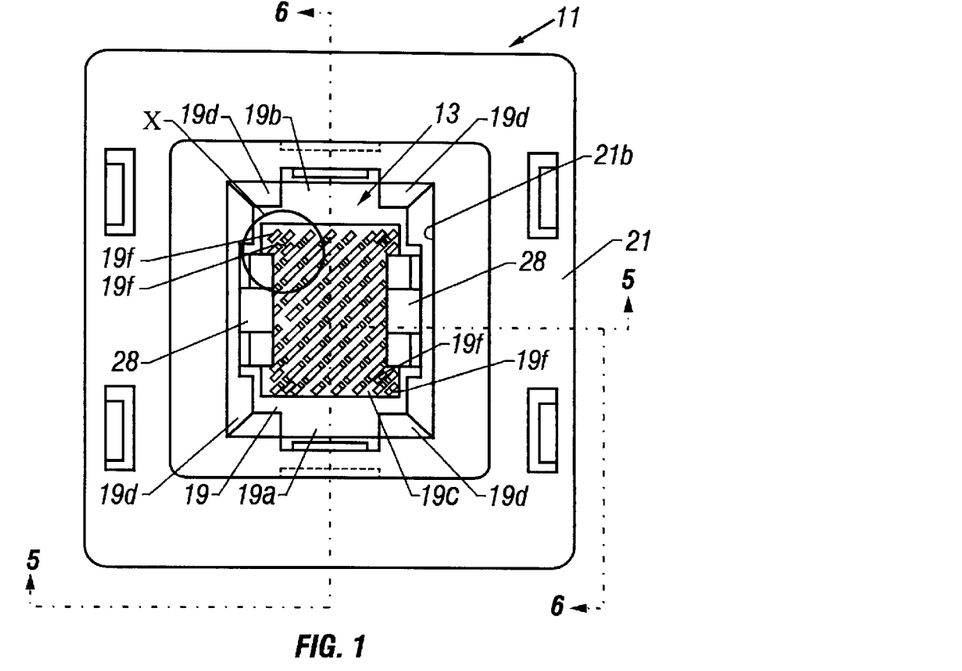
FIG. 1 is a plan view of an IC socket according to a first embodiment of the present invention.

Furthermore, the upper operation member 21 is, as shown in FIG. 1, formed with an opening 21b of a size capable of being accommodated with the IC package 12, and the IC package 12 is inserted through this opening 21b and accommodated to the predetermined position on the accommodation portion 19a of the upper plate 19. The upper operation member 19 is, as shown in FIGS. 5 and 6, are arranged to be vertically movable and is urged upward by means of spring 27. When the upper operation member 19 is moved to the uppermost position, an engaging claw 21d of the upper operation member 19 is engaged with an engagement portion of the socket body 13 thereby to prevent the upper operation member 19 from coming off.

Still furthermore, the upper operation member 19 is further formed with an operation portion for rotating a latch member 28 as shown in FIG. 5 other than the cam surface 21a for rotating the arm member 23.

As shown in FIG. 5, the latch member 28 is mounted to the socket body 13 to be pivotal about a shaft (pivot pin) 28a and urged by means of spring 29 in the counterclockwise direction so that the peripheral edge portion of the IC package 12 is pressed by a press portion 28b formed to the front end portion of the latch member 28.

The latch member 28 is further formed with a pressed portion 28c (portion to be pressed) on which the operation portion 21c of the upper operation member 21 slides, and when the upper operation member 21 is lowered, the operation portion 21c slides on the pressed portion 28c thereby to rotate the latch 28 in the clockwise direction in FIG. 5 and to retire the press portion 28b from the IC package arrangement position.

The IC socket of the structure mentioned above will operate in the following manner.

When the IC package 12 is set to the IC socket 11, the upper operation member 21 is first depressed downward. Then, the arm members 23 are rotated by the cam surface 21a of the upper operation member 21 in the counterclockwise direction in FIG. 6 and the movable plate 17 is hence moved downward. According to the lowering of the movable plate 17, the cam portions 17a are also lowered as shown in FIGS. 9A to 9C and the bent portions 15e of the contact pins 15 are pressed by the sliding surfaces 17b of the cam portions 17a thereby to open the paired contact portions 15d of the contact pins 15 as shown in FIG. 9B.

At the same time, the portion 28c to be pressed of the latch member 28 is pressed and rotated against the urging force of the spring 29 in the clockwise direction as shown in FIG. 2 and the press portion 28b is displaced to the retiring position.

Under the state mentioned above, the IC package 12 is guided by the guide portions 19b on the accommodation portion 19a of the upper plate 19, and four solder balls 12b, separated by plural pitches, are positioned by the corresponding paired projections 19f formed at four corner portions of the upper plate 19 are then positioned. The solder balls 12b of the IC package 12 are inserted, under non-contact state, in the gap between the opened paired contact portions 15d of the respective contact pins 15 and then positioned.

According to the manner mentioned above, the four solder balls 12b are restricted in their motion in one direction by the projections 19f and also restricted in their motion in the other direction (normal to that one direction) by the paired elastic pieces 15a of the respective contact pins 15.

Furthermore, according to the manner mentioned above, since the solder balls 12b separated by the plural pitches can be positioned, the positioning performance or precision of the IC package 12 with respect to the socket body 13 can be improved, and in comparison with the structure that all the solder balls 12b are positioned, according to the present invention, since it is only required to form four pairs of the projections 19f, the manufacturing performance of molds and formability of the projections can be improved.

Furthermore, according to the structure of the present invention, since the position of one solder ball 12b can be restricted in all, i.e. four directions, by the projections and the contact pin 15, so that the positional precision can be further improved.

Still furthermore, since the respective paired projections 19f are arranged at the positions corresponding to the outermost ones of the solder balls 12b on the diagonal lines of the IC package 12, the distance between the projections 19f can be made maximum, thus further improving the positioning precision.

Thereafter, when the downward depressing force of the upper operation member 21 is released, the upper operation member 21 is urged upward by the spring 27 and hence moved upward, and accordingly, the movable plate 17 is moved upward by means of the spring 22 and the latch member 28 is rotated by the urging force of the spring 29 in the counterclockwise direction as viewed in FIG. 2.

When the movable member 17 is moved upward, the pressing force of the cam portions 17a to the bent portions 15e of the contact pins 15 are released and the paired contact portions 15d of each of the contact pins 15 are moved in the direction for closing or narrowing the gap therebetween, thus clamping the solder ball 12b between the contact portions 15d as shown in the state of FIG. 9C. In this operation, even if the positional precisions of the respective solder balls 12b are dispersed (irregular), since the paired elastic pieces 15a are elastically deformed, such dispersion or irregularity can be made absorbed and substantially eliminated.

Further, in the IC package mounting manner mentioned above, the IC package 12 is in a state floating from the inside surface 19c of the socket body 13. Therefore, in comparison with the structure that the entire surface of the IC package 12 contacts the upper plate 19 of the socket body, in the described embodiment, a gap exists at the lower surface portion of the IC package 12, and accordingly, the heat radiation effect to the heat generated to the IC package 12 at a time of Burn-in Test will be improved. Furthermore, there is reduced the possibility of the IC package 12 being inserted in an inclined manner due to the dispersion of the flatness of the IC package mounting surface of adhesion of foreign material and bowing (warping) or the like of the IC package 12 will be slightly acceptable.

According to the manners mentioned above, the respective solder balls 12b of the IC package 12 and the printed circuit board can be electrically connected through the contact pins 15.

On the other hand, in the case where the IC package 12 is dismounted (removed) from the mounted state, the upper operation member 21 is first lowered thereby to separate the paired contact portions 15d of the contact pins 15 from the solder balls 12b, respectively, so that the IC package 12 can be removed easily with a force smaller than that required for the case of pulling out the IC package 12 from the clamping state of the solder ball 12b between the contact portions 15d.

According to the structure of the described embodiment of the present invention, the cam portions 17a of the movable plate 17 for opening and closing the paired contact portions 15d of the respective contact pins 15 are not inserted into the gaps between the respective contact portions 15d and are arranged between the respective contact pins 15, so that it is not necessary to insert the cam portions 17a between the respective pairs of the closed contact portions 15d, and accordingly, the assembling workability can be improved.

Second Embodiment 2

Figure 10A:
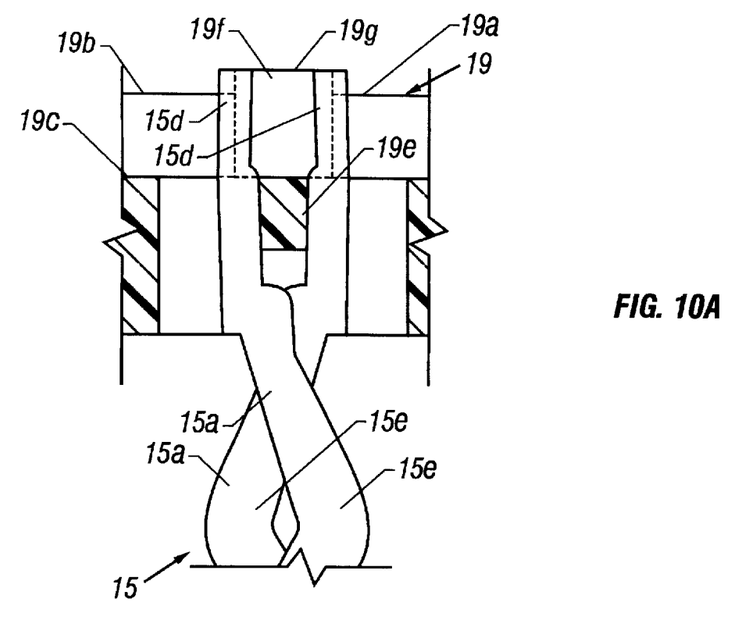
Figure 10B:
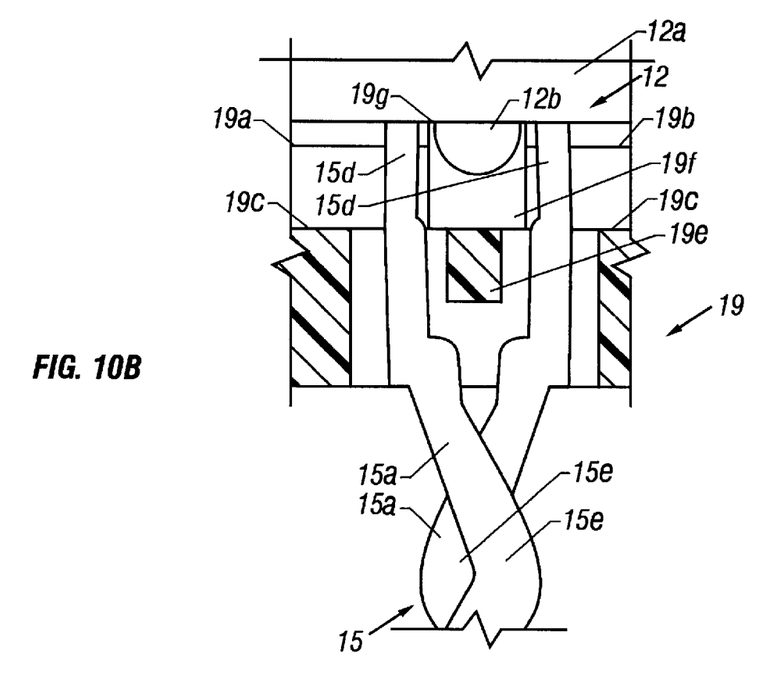

FIGS. 10A and 10B represent the second embodiment of the present invention.

In this embodiment, with reference to FIGS. 10A and 10B, it is constructed that four projections 19f and contact pins 15 project over the peripheral accommodation surface 19b of the upper plate 19 so that the IC package 12 is supported by these four projections 19f and the contact pins 15. Therefore, the heat radiation effect to the heat generated to the IC package 12 in the Burn-in Test can be further improved. Furthermore, there is reduced the possibility of the IC package 12 being inserted in an inclined manner due to the dispersion of the flatness of the IC package mounting surface of adhesion of foreign material and bowing (warping) or the like of the IC package 12 will be slightly acceptable.

Further, it is to be noted that since the structures and functions of the second embodiment other than those mentioned above are substantially the same as those of the first embodiment, the explanations thereof are omitted herein.

It is also noted that the present invention is not limited to the described embodiments and many other changes and modifications may be made without departing from the scopes of the appended claims.

For example, in the described embodiments, although the present invention is applied to the IC socket 11 as "socket for electrical parts", the present invention is not limited to that and also applicable to other devices or the like.

Furthermore, although the present invention is applied to the IC socket for the BGA type IC package, the shape of the terminal is not limited to the described one as far as the terminal is positioned.

Still furthermore, in the described embodiments, each of the contact pins 15 has a pair of contact portions 15d thereby to clamp the terminal of the electrical part therebetween. However, the present invention is applicable to the structure that the contact portion is pressed against one side of the terminal thereby to limit the movement of the terminal.

Still furthermore, in the described embodiments, although the positioning members are formed at four portions in conformity with the outermost solder balls on the diagonal lines of the IC package, the present invention is not limited to this arrangement, and it may be adopted to arrange the positioning members at three or more portions than two portions. Further, the arranging positions are not limited to the outermost portions or peripheral edge portion of the IC package, and many other portions may be adopted as far as the respective positioning members are arranged with a plurality of pitches therebetween. The positioning member is not limited to the projection 19f mentioned herein and there may be adopted recessed portions having predetermined dimension and shape.

What is claimed is:

1. A socket for an electrical part comprising:
   a socket body;
   an accommodation portion coupled to the socket body, said accommodation portion adapted to receive the electrical part including a plurality of terminals arranged with a predetermined pitch;
   a plurality of contact pins arranged on the socket body, said plurality of contact pins adapted to contact or separate from said plurality of terminals; and
   a positioning structure provided on said accommodation portion of the socket body, said positioning structure configured to position only a group of said plurality of terminals not adjacent to each other on said accommodation portion, such that said group of said plurality of terminals not adjacent to each other are skewed from each other by a plurality of pitches.

2. A socket for an electrical part according to claim 1, wherein the terminal of the electrical part is restricted in a movement thereof in one direction by the positioning structure and restricted in a movement in another one direction by the contact pin.

3. A socket for an electrical part according to claim 2, wherein said contact pin projects over a surface of the accommodation portion of the socket body.

4. A socket for an electrical part according to claim 2, wherein said contact pin is formed with a pair of elastic pieces having front end portions between which the terminal is clamped and the clamping direction accords with said another one direction.

5. A socket for an electrical part according to claim 2, wherein said one and another one direction are directions normal to each other.

6. A socket for an electrical part according to claim 1, wherein said electrical part has a substantially rectangular shape and said positioning structure includes at least two positioning members arranged at positions corresponding to at least two terminals disposed to outermost portions on a diagonal line of the rectangular shape of the electrical part.

7. A socket for an electrical part according to claim 6, wherein said positioning structure includes four positioning members arranged at four corner portions of the rectangular electrical part on diagonal lines thereof.

8. A socket for an electrical part according to claim 1, wherein said positioning structure comprises a projection member projecting over a surface of the accommodation portion of the socket body.

9. A socket for an electrical part according to claim 8, wherein said projection member is composed of a pair of projections between which the terminal is to be clamped.

10. A socket for an electrical part according to claim 1, wherein said terminal is a solder ball.

11. A socket for an electrical part according to claim 1, wherein said socket is an IC socket and said electrical part is an IC package.

* * * * *

UNITED STATES PATENT AND TRADEMARK OFFICE
CERTIFICATE OF CORRECTION

PATENT NO.     : 6,293,809 B1
DATED          : September 25, 2001
INVENTOR(S)    : Hideo Shimada It is certified that error appears in the above-identified patent and that said Letters Patent is hereby corrected as shown below:

Column 8,
Line 31, please delete "including" and insert -- having --.
Line 35, please delete "said" and insert -- the --.
Beginning at line 36 and ending on line 42 please delete the entire paragraph and insert the following new paragraph:
-- the accommodation portion of the socket body having a plurality of positioning portions adapted to position a number of terminals fewer than all terminals of the electrical part, wherein the plurality of positioning portions position terminals that are not adjacent to each other. --

Signed and Sealed this

Sixth Day of August, 2002

Attest:

JAMES E. ROGAN
*Attesting Officer*        *Director of the United States Patent and Trademark Office*